United States Patent [19]
Sugiki et al.

[11] Patent Number: 5,731,722
[45] Date of Patent: Mar. 24, 1998

[54] LOW POWER CAPACITIVE LOAD DRIVING CIRCUIT

[75] Inventors: Tadashi Sugiki; Yukinori Ando, both of Kanagawa-ken, Japan

[73] Assignee: Kabushiki Kaisha Toshiba, Kawasaki, Japan

[21] Appl. No.: 508,460

[22] Filed: Jul. 28, 1995

[30] Foreign Application Priority Data

Jul. 28, 1994 [JP] Japan .................... 6-176485

[51] Int. Cl.⁶ .......................... H03K 17/16; G11C 27/04
[52] U.S. Cl. .......................... 327/111; 327/284; 377/63
[58] Field of Search .......................... 327/111, 110, 327/108, 168, 304, 284, 379; 377/63, 62, 60

[56] References Cited

U.S. PATENT DOCUMENTS

| | | | |
|---|---|---|---|
| 3,858,059 | 12/1974 | Khanna | 327/111 |
| 4,597,092 | 6/1986 | Furusawa et al. | 377/63 |
| 4,877,980 | 10/1989 | Kubinec | 327/111 |
| 5,285,370 | 2/1994 | Axer et al. | 363/59 |

FOREIGN PATENT DOCUMENTS

| | | | |
|---|---|---|---|
| 0 350 191 A2 | 1/1990 | European Pat. Off. | H02M 3/337 |
| 56-80893 | 7/1981 | Japan | G11C 27/00 |
| 1303757 | 12/1989 | Japan | H01L 29/76 |
| 533875 | 5/1993 | Japan | H04N 5/335 |

OTHER PUBLICATIONS

Patent Abstracts of Japan; vol. 014 No. 139 (E–0903), 15 Mar. 1990 & JP–A–02 002290 (Toshiba Corp) 8 Jan. 1990.

Patent Abstracts of Japan; vol. 014 No. 099 (E–0893), 22 Feb. 1990 & JP–A–01 303757 (Hitachi Ltd) 7 Dec. 1989.

Patent Abstracts of Japan; vol. 005 No. 150 (P–081), 22 Sep. 1981 & JP–A–56 080893 (Matsushita Electric Ind Co Ltd) 2 Jul. 1981.

*Primary Examiner*—Timothy P. Callahan
*Assistant Examiner*—Terry L. Englund
*Attorney, Agent, or Firm*—Cushman, Darby & Cushman IP Group of Pillsbury, Madison & Sutro LLP

[57] ABSTRACT

A circuit for driving a capacitive load uses a plurality of driving signals with different phases including a quiescent time, and a driving time having a driving duration and an other time. An inductance element is connected across the driving terminals of the capacitive load, and a switch circuit is provided between a driving voltage source and the capacitive load. During the quiescent time, the switch circuit is closed to make the driving voltages the same potential, minimizing energy loss since no current flows during the quiescent time. During the driving time, the switch circuit is closed for a predetermined driving duration to clamp a sine wave around the peaks of the waveform, and the switch circuit is open during the other time when the sine wave is not at any of its peaks.

2 Claims, 7 Drawing Sheets

LOW POWER CAPACITIVE LOAD DRIVING CIRCUIT

BACKGROUND OF THE INVENTION

1. Field of the Invention

The present invention relates to a capacitive load driving circuit such as a charge-coupled type image pickup device or an electrostatic actuator which is used for a video camera, and more particularly, to a capacitive load driving circuit with a low power consumption.

2. Background Information

Capacitive load such as charge-coupled device (CCD) type image pickup devices and electrostatic actuators are used in many applications, due to features such as small size, light weight, and low power consumption. However, in practice, driving systems for these capacitive loads do not necessarily have low power consumption. That is, the equivalent circuit of these elements may have low power consumption when there is no current flow during the quiescent time (the time when no input signal is sent to the CCD) since the equivalent circuit is comprised of a capacitance C0 coupled across driving terminal and capacitance C1, C2 of each terminal, as shown in FIG. 7. However, these systems could consume a relatively high amount of energy. This relationship is shown by the equation: power = [frequency]×[equivalent capacitance]×[driving voltage]$^2$ at the charging and discharging of the capacitance in the driving time. For instance, a CCD designed for HDTV with 1,300 pixels consumes a large amount of power as shown in the following equation, when the driving duration is 48.6 MHz, the driving voltage is 6 V, and the equivalent capacitance is 300 pF.

$$48.6\ MHz \times 300\ pF \times (6\ V)^2 = 524\ mW$$

FIG. 8 shows a circuit disclosed in Japanese Patent Disclosure: Tokkai-Sho 56-80893 that was designed to solve the above problems. An inductance element L is located across driving terminals 7a and 7b to construct a parallel resonance circuit with capacitances C0, C1, C2 at the driving terminals. Low power consumption is planned by making the resonance frequency equal to the driving duration.

The driving system is useful to transmit a signal continuously, such as a CCD delay line. However, a CCD image pickup device having a quiescent time in the driving signal or the electrostatic actuator still increased the power consumption since a relatively large amount of current flows through the inductance element during the quiescent time of the driving signal.

FIG. 9 shows a driving system disclosed in Japanese Patent Disclosure Tokko-Hei 5-33875 to solve this problem. A circuit has a capacitor C8 and an inductance element L connected in series which are coupled across the driving terminals. The capacitor C8 interrupts the current during the quiescent time to keep the amount of electric power consumed low.

However, this driving system has a problem with an undesirable rise-time characteristic in the driving waveform, as shown in FIG. 10, since resonance occurs around the voltage which is charged during the quiescent time, due to the series connection between the capacitor C8 and the inductance element L.

Further, in the driving system disclosed in the Japanese Patent Disclosure: Tokko-Hei 1-303757, a circuit has switch circuit S1 and an inductance element L in series which are coupled between the driving terminals 10a and 10b, as shown in FIG. 11. The switch S1 is opened to use an LC resonance when inverting the driving potential. The switch S1 is opened, while switches S2 and S3 connected in series with the driving voltage source are closed to protect the potential of the driving terminal when the driving potential is inverted.

However, this driving system has also drawbacks in that the power consumption caused by an ON resistance of the switch S1, which is connected in series with the inductance element L, and the driving waveform is disturbed when the ON period of the switches are outside half of the period of the resonance circuit composed of the inductance element L and the capacitors at the driving terminals.

As described above, there are drawbacks associated with the conventional capacitive load driving circuit having an inductance element coupled across the driving terminals to allow current flow through the inductor during the quiescent time. Additionally, a driving circuit having a capacitor and an inductance element connected in series and coupled across the driving terminals has a problem with an undesirable rise-time characteristic in the driving waveform. Also, the driving circuit having a switch and an inductance element connected in series and coupled across the driving terminals consumes a large amount of power due to the ON resistance of the switch.

SUMMARY OF THE INVENTION

It is, therefore, an object of the present invention to provide a capacitive load driving circuit with relatively low power consumption and a desirable rise-time characteristic of the driving waveform.

In order to achieve the above object, a capacitive load driving circuit according to one aspect of the present invention drives a capacitive load by using a plurality of driving signals with different phases including a quiescent time. The capacitive load driving circuit has an inductance element connected across the driving terminals of the capacitive load and a switch circuit provided between a driving voltage source and the capacitive load. At the quiescent time, the switch circuit is closed while the driving voltage sources apply the same potential across the capacitive load. This permits any potential difference across the capacitive load to diminish until it is eliminated. By contrast, there is a difference in potential across the driving voltage sources during a driving time. At a predetermined driving period during the driving time, the switch circuit is closed, and for any other time during the driving time the switch circuit is opened.

According to the driving circuit as described above, little, if any, current flows during the quiescent time, even if the inductance is coupled across the driving terminals, since there is no difference in potential between the outputs from the driving voltage sources. In the driving period within the driving time, the switches are closed around the peaks of the driving waveform. The inversions in potential at the driving terminals caused by the LC resonance make the use of additional power supply almost unnecessary. Further, since the circuit has only one resonance frequency, the rise-time characteristic of the driving waveform is desirable. Furthermore, since the inductance element is directly coupled across the driving terminals, the Q has a higher value and the energy loss will be small.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
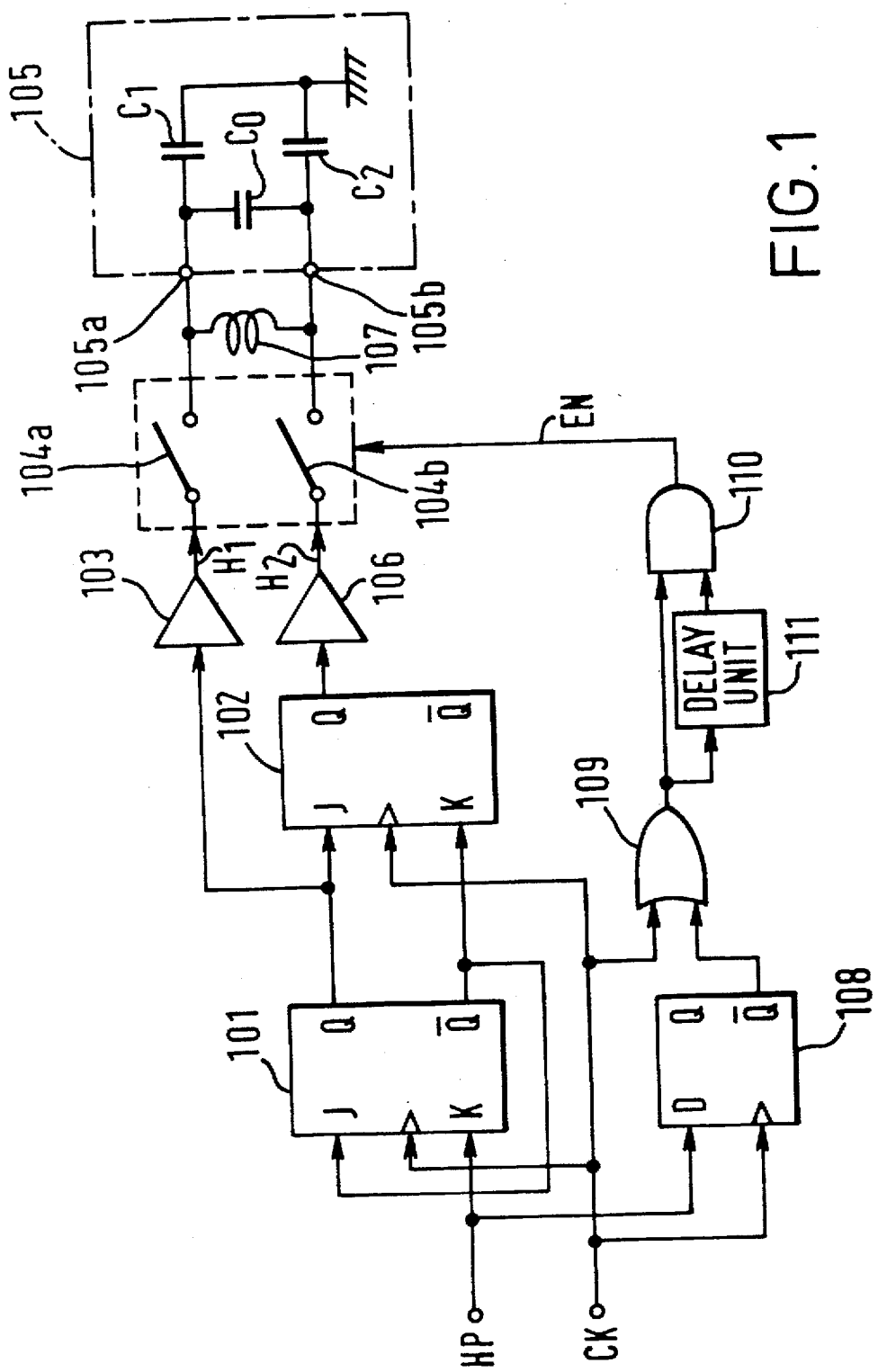
FIG. 1 is a circuit diagram for explaining one embodiment of the capacitive load driving circuit according to the present invention.

The present invention will be described in detail with reference to the FIGS. 1 through 6. Throughout the drawings, like or equivalent reference numerals or letters will be used to designate like or equivalent elements for simplicity of explanation.

Figure 2:
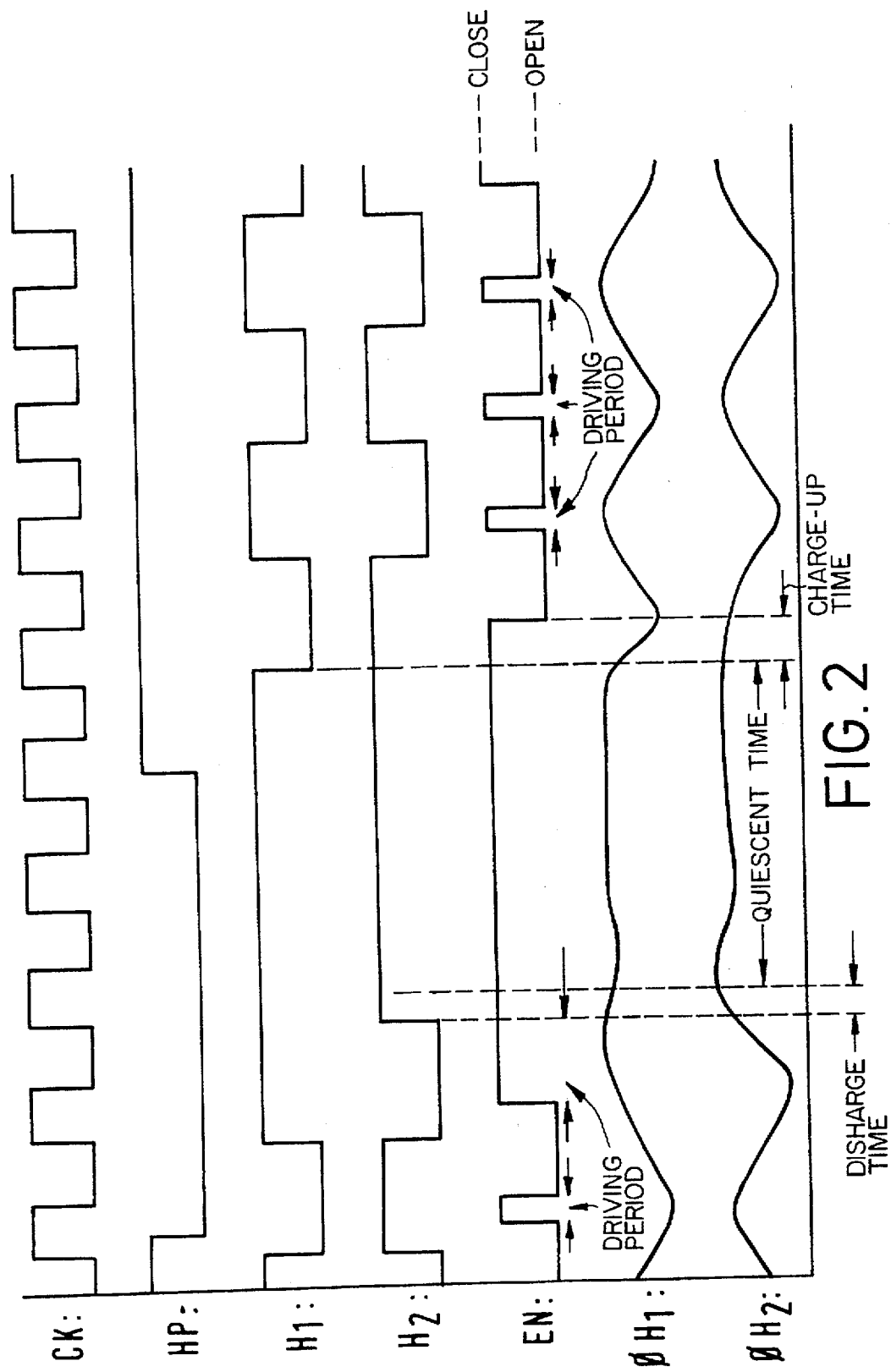
FIG. 2 is a timing chart for explaining the operation of FIG. 1.

FIG. 1 shows a circuit diagram for explaining one embodiment of the present invention, while FIG. 2 shows a timing chart for explaining the operation.

In FIG. 1, a terminal HP which receives a halting pulse for halting a horizontal transfer CCD is connected to the K input of the JK flip-flop (JK-FF) 101. A potential therefore can be applied to the K input of the JK flip-flop (JK-FF) 101 via the terminal HP. The J input of the JK-FF 101 is connected to the inverse Q output of the JK-FF 101. The Q output of the JK-FF 101 and its inverse-Q output are connected to the J and K inputs of the JK-FF 102, respectively. The Q output of the JK-FF 101 is connected to a driving terminal 105a of a CCD 105 through a buffer amplifier 103 and a switch 104a, in that order. The Q output of the JK-FF 102 is connected to another driving terminal 105b of the CCD 105 through a buffer amplifier 106 and a switch 104b, in that order. An inductance element 107 is coupled across the driving terminals 105a and 105b.

The terminal HP is also connected to the D input of a D type flip-flop (D-FF) 108. A clock input terminal CK is connected to the clock inputs of the JK-FFs 101 and 102, the D-FF 108, and one input of an OR gate 109. The other input of the OR gate 109 is connected to the inverse-Q output of the D-FF 108. The output of the OR gate 109 is connected to one input of an AND gate 110 and also to the other input of the AND gate 110 through a delay unit 111. The output of the AND gate 110 controls the ON or OFF operation of the switches 104a and 104b.

Next, the operation of the above embodiment will be explained hereinafter. The terminal HP will remain in the low potential during a portion of the quiescent time. Accordingly, the K input of the JK-FF 101 will be in the low potential. Since the J input of the JK-FF 101 is connected to the inverse-Q output of JK-FF 101, both the J and K inputs of the JK-FF 101 assume the low potential when the Q output of the JK-FF 101 is in the high potential. Then the Q output of the JK-FF 101 remains in the high potential even if the clock CK is input to the JK-FF 101. Since the J input of the JK-FF 101 is in the high potential, the K input is in the low potential, when the Q output of the JK-FF 101 is in the low potential. Then the Q output will be in the high potential by the next clock CK input. That is, the Q output of the JK-FF 101 assumes the high potential from the next clock as long as the low potential is applied to the HP terminal.

In a discharge time, the J and K inputs of the JK-FF 102 are connected to the Q and the inverse-Q outputs of the JK-FF 101, respectively, the JK-FF 102 outputs are delayed by one clock period from the JK-FF 101 output. The outputs of the JK-FF 101 and 102 will be in the high potential, and the output signals H1 and H2 of the buffer amplifiers 103 and 104 will be in the high potential in the quiescent time. Further, in the quiescent time, the inverse-Q output of the D-FF 108 will be in the high potential. Then the output of the OR gate 109, both inputs of the AND gate 110, and the control signal EN, which is output from the AND gate 110 and controls switches 104a and 104b, will attain the high potential, in that order. Accordingly, the terminals 105a and 105b of the CCD 105 continue to receive the high potentials.

Next, in a charge up time, since the J input of the JK-FF 101 will be in the low potential as the HP terminal attains the high potential, the Q output of the JK-FF 101 will be in the low potential by the next clock CK input. Since the J and K inputs of the JK-FF 101 attain the high potential at the next clock signal, the outputs of the JK-FF 101 will be inverted. That is, the JK-FF 101 inverts whenever the clock is input. The outputs of the JK-FF 101 will be divided by 2 to obtain the frequency of the clock CK.

The JK-FF 102 delays the outputs of the JK-FF 101 by one clock period of the CK. Thus there is an inverse relationship between the Q output of the JK-FF 101 and the Q output of the JK-FF 102. Further, since the inverse-Q output of the D-FF 108 will be in the low potential, the clock CK is output from the OR gate 109. The AND gate 110 is supplied with two clocks having different timings through the direct line and the delay unit 111, and thus the AND gate outputs narrow high potential pulses as the control signal EN. Using this control signal EN, the switches 104a and 104b are closed only for a predetermined limited driving period to clamp the sinusoidal wave oscillation in a parallel resonance circuit for every peak and trough of the sinusoidal wave. The parallel resonance circuit is comprised of the CCD 105 and the inductance element 107. So, driving waveforms φH1 and φH2 which appear on the driving terminals 105a and 105b will be desirable, as shown in FIG. 2.

In this embodiment, little if any, current flows during the quiescent time even if the inductance element 107 is coupled across the driving terminals 105a and 105b, since no difference in potential is occurring across the output signals from the buffer amplifiers 103 and 104. In the driving time, the switches 104a and 104b are closed around the peak of the driving waveform at the driving period within the driving time. The inversion of the potential at the driving terminals caused by the LC resonance makes the power supply from the driving power source almost unnecessary. Further, since the driving circuit has only one resonance frequency, the rise-time characteristic of the driving waveforms φH1 and φH2 are desirable. Furthermore, since the inductance element 107 is directly coupled across the driving terminals 105a and 105b the Q will take the high value and the energy loss will be small.

Figure 3:
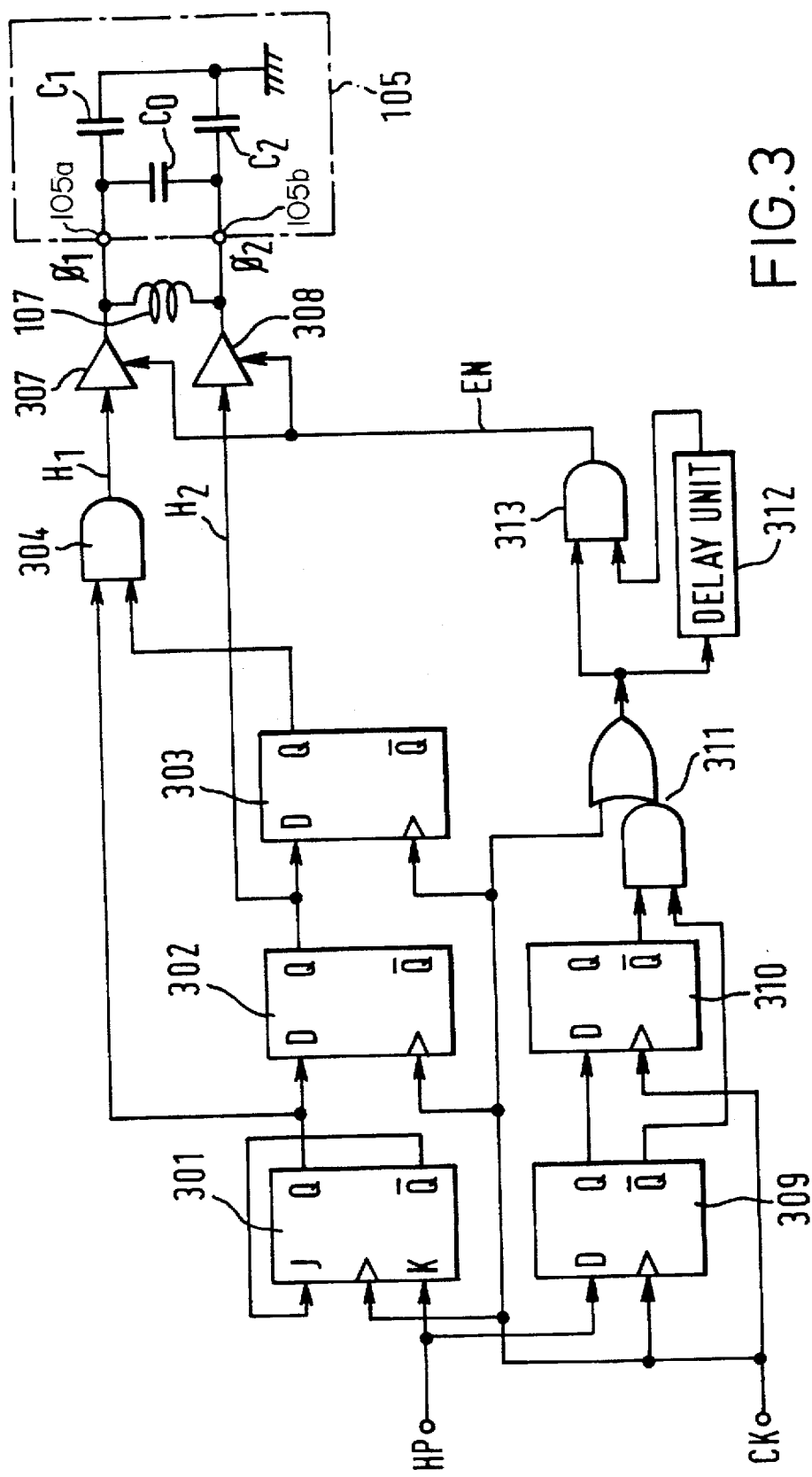
FIG. 3 is a circuit diagram for explaining another embodiment of the present invention.

FIG. 3 is a circuit diagram for explaining another embodiment of the present invention. In FIG. 3, the JK-FF 301 performs the same operation as the JK-FF 101 in FIG. 1. The D-FFs 302 and 303 respectively delay its input signals for one clock period. Accordingly, a signal which has a high potential in the quiescent time and a frequency divided by 2 for the clock and a signal which is delayed for two clock periods are applied to the two inputs of the AND gate 304. The output pulse from AND gate 304 is the output pulse H1 having one pulse more than the output pulse H2 from the D-FF 302.

The HP signal, which operates as the reference signal in the quiescent time, is narrowed in width by one clock pulse by the D-FFs 309, 310 and the AND OR gate 311, and then an OR-logic operation is executed on the HP signal with the clock CK. The OR gated signal is delayed in the delay line 312 to keep the high potential in the quiescent time and also to generate the small duty cycle control signal EN in the driving time by the AND gate 313. The control signal EN is then applied to the control terminals of the three-state buffers 307 and 308. The three-state buffers 307 and 308 combine the function of the driving voltage source and the function of the switch shown in FIG. 1. Thus, it is possible to drive the CCD 105 with a small output resistance and also to drive with a low power consumption.

For example, assume that the capacitance difference CO across the driving terminals 105a and 105b of the CCD 105 is 60 pF, and the capacitance C1 and C2 across the driving terminals and ground potential is 40 pF. The capacitive load is driven at 48.6 MHz and 6 V amplitude. With these values, the driving circuit is able to drive the capacitive load with only 31 mW at the non resonance driving, which is very small compared with the 560 mW at the non-resonance driving in the prior art.

Figure 4:
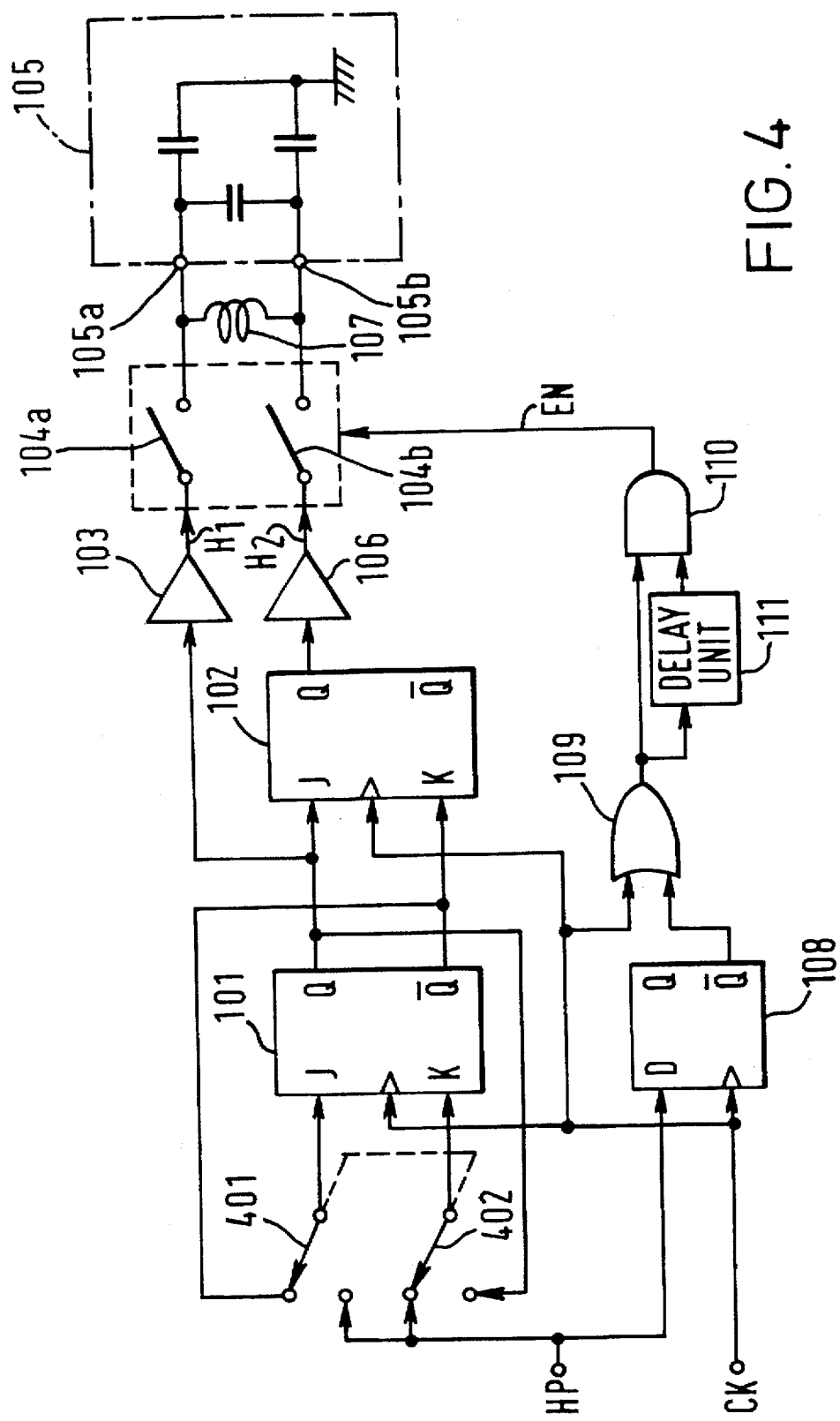
FIG. 4 is a circuit diagram for explaining still another embodiment of the present invention.

FIG. 4 is a circuit diagram for explaining another embodiment of the present invention which can optionally select the high potential or the low potential as the driving potential in the quiescent time. This embodiment is different from the embodiment of FIG. 1 in that additional switches 401 and 402 are provided to the J and K inputs of the JK-FF 101.

In CCD image pickup devices, it is desirable to set up a higher potential for the CCD to rapidly sweep out undesired electric charges at the operation of electronic shutters into the drain of the horizontal transfer CCD next to the CCD. At the same time, it is desirable to setup a lower potential for the horizontal transfer CCD to make receiving the signal potential from a vertical transfer CCD in a video signal outputting term easy.

That is, when the switches 401 and 402 are in the states as shown in FIG. 4, the circuit of FIG. 4 will operate the same as the circuit of FIG. 1. When the switches 401 and 402 move into the other states and the HP terminal is in the quiescent time, the Q outputs of the JK-FFs 101 and 102 will be at low potential and the output of the OR gate 109, and the output signals H1 and H2 of the buffer amplifiers 103 and 106 will also be in the low potential. Further, in the quiescent time, the inverse −Q output of the D-FF 108 will be in the low potential. The output of the OR gate 109, and both inputs of the AND gate 110 and the control signal EN of switches 104a and 104b, which is output from the AND gate 110, will also go to low potential in this order. Accordingly, the driving terminals 105a and 105b of the CCD 105 continue to receive the low potentials during the quiescent time.

Accordingly, it is possible to optionally select the high potential or the low potential for the driving signals in the quiescent time by properly operating the switch 104a and 104b. In this embodiment, it is desirable to set up a higher potential for the CCD for rapidly sweeping out undesired electric charges at the operation of electronic shutters into the drain of the horizontal transfer CCD next to the CCD. On the other hand, it is desirable to set up a lower potential for the horizontal transfer CCD so as to make receiving the signal potential from a vertical transfer CCD in a video signal outputting term easy.

Figure 5:
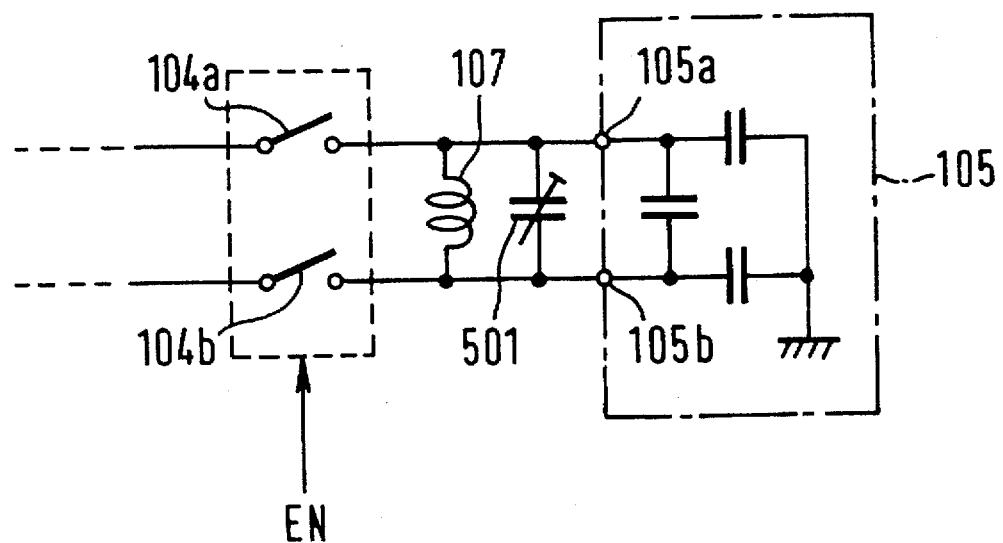
FIG. 5 is a circuit diagram for explaining a further embodiment of the present invention.

FIG. 5 is a circuit diagram showing a portion of the capacitive load driving circuit. Switches 104a and 104b in the CCD 105 are depicted to explain a still further embodiment of the present invention. This embodiment has a trimmer capacitor 501 coupled across the driving terminals 105a and 105b, i.e., across the inductance element 107. Thus, even if the capacitances of the CCD 105 vary greatly, this embodiment is able to plan the saving of power consumption by matching the resonance frequency of the CCD 105 and the inductance element 107 with the driving frequency through the adjustment of the trimmer capacitor 501.

Figure 6:
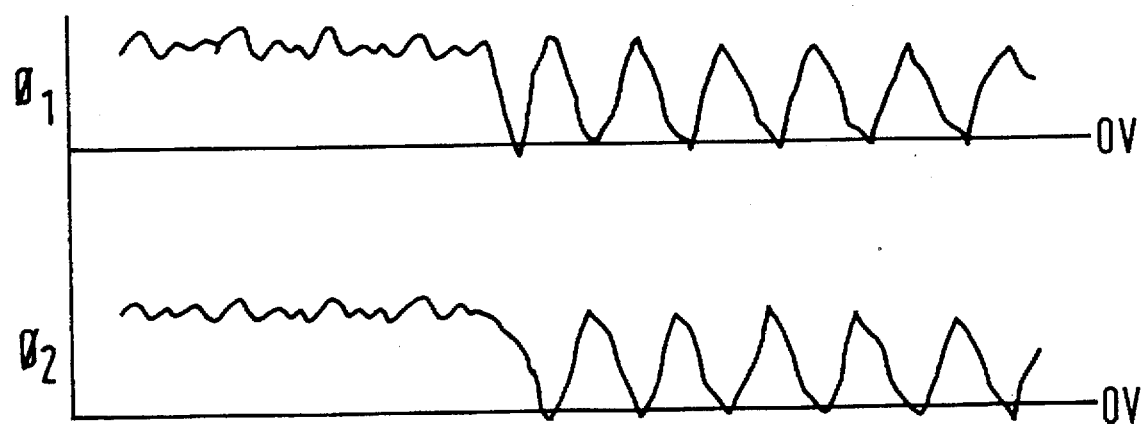
FIG. 6 is a waveform diagram for explaining the effect of the still further embodiment of the present invention.
Figure 7:
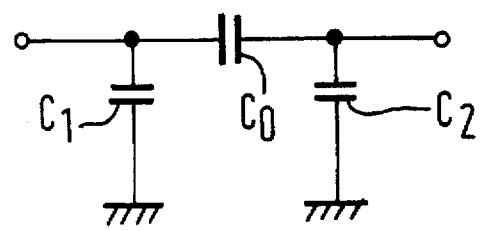
FIG. 7 is an equivalent circuit showing a general capacitive load.
Figure 8:
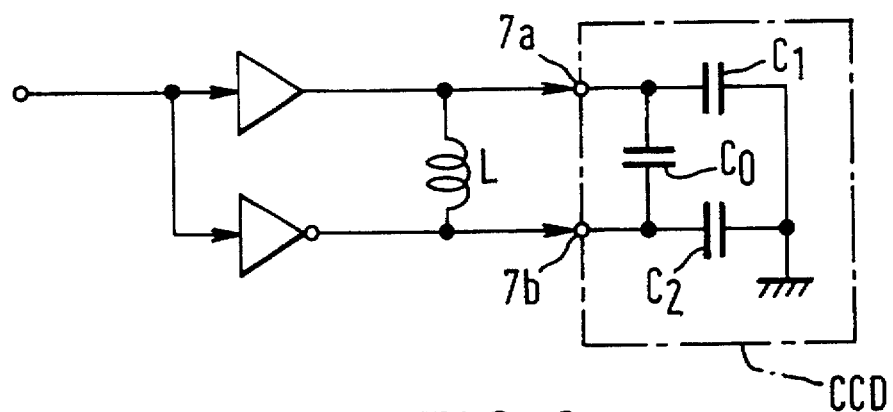
FIG. 8 is a diagram showing a conventional driving circuit for driving a CCD with low power consumption.
Figure 9:
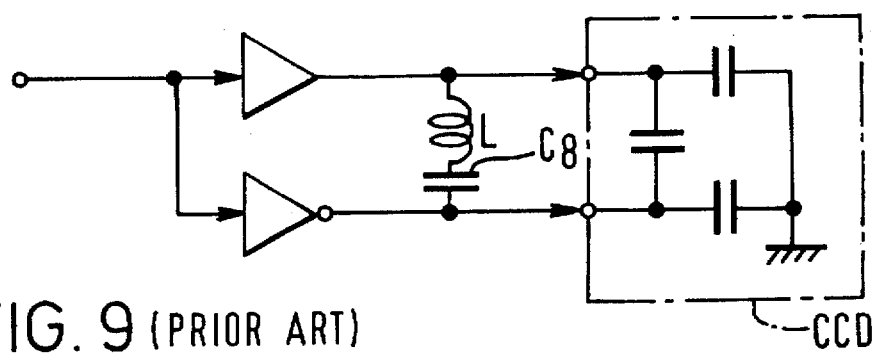
FIG. 9 is a diagram showing another conventional driving circuit for driving a CCD with low power consumption.
Figure 10:
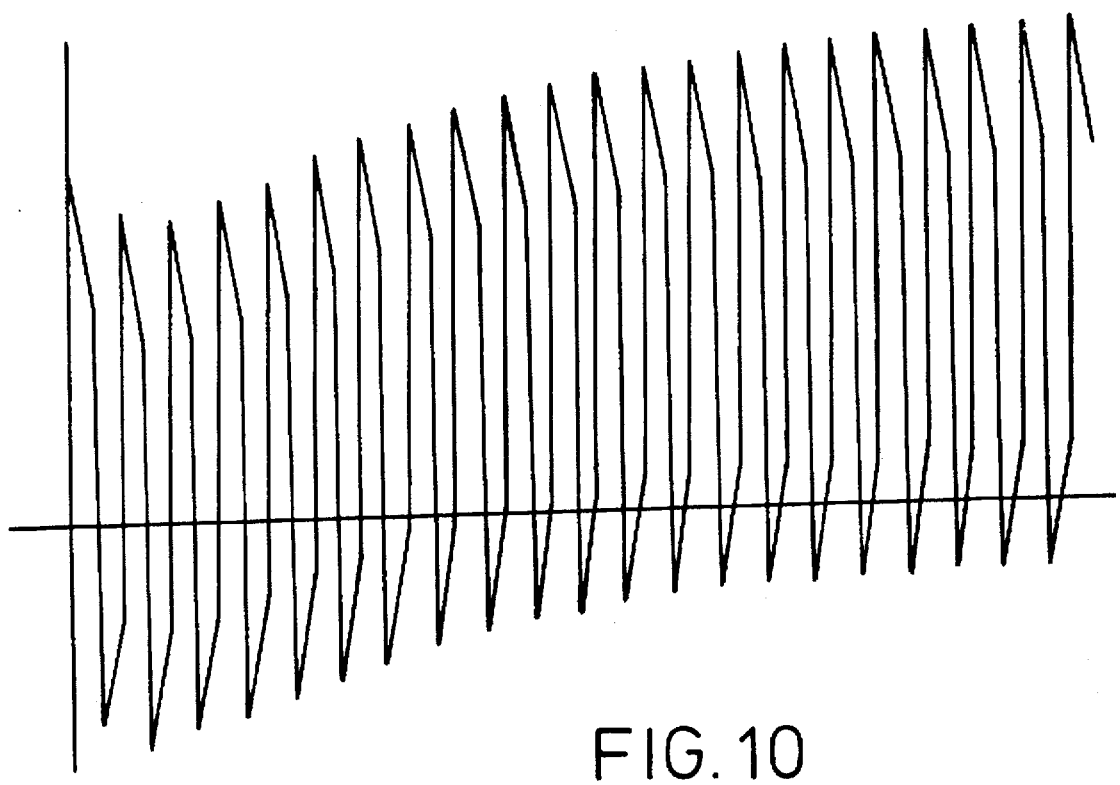
FIG. 10 is a drawing for explaining the rise-time characteristic of the driving waveform in FIG. 8.
Figure 11:
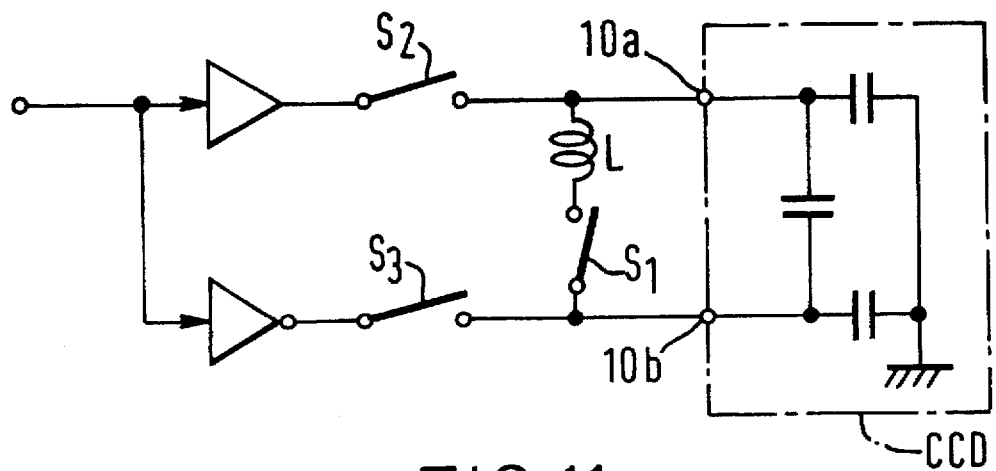
FIG. 11 is a drawing showing still another conventional driving circuit for driving a CCD with a low power consumption.

Further, it is able to suppress undershoots and overshoots in the driving waveforms, as shown in FIG. 6, by adding a current limiting circuit to the driving sources of the CCD 105 and the inductance element 107 to limit the slew rate of the rise-time of the driving waveform. The current limiting circuit is able to be performed by the buffer amplifiers in the above embodiments. It is thus essential only that any appropriate means capable of limiting current is provided.

As described above, the present invention can provide extremely preferable capacitive load driving circuits which drive with a low power consumption, have a good rise-time characteristic in the driving waveform, and adapt resonance frequency to the driving duration when the load capacity of the capacitive load varies greatly.

While there have been illustrated and described what are at present considered to be preferred embodiments of the present invention, it will be understood by those skilled in the art that various changes and modifications may be made and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims. For example, the capacitive load may be electrostatic motors or ultrasonic motors other than the CCDs.

The foregoing description and the drawings are regarded by the applicant as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer of alternative inventive concepts that are included in the contents of the application and could be defined by claims differing in scope from the following claims, which different claims may be adopted subsequently during prosecution, for example, for the purposes of a divisional application.

What is claimed is:

1. A circuit for driving a capacitive load comprising:

an inductance element connected across driving terminals of the capacitive load; and a switch circuit provided between a driving voltage source having plural outputs and the capacitive load, wherein during a quiescent time, there is no difference in potential between outputs from said driving voltage source, and the switch circuit is closed to diminish any difference in voltage across the driving terminals, thereby preventing current flow in said inductance element, during a driving time alternating with said quiescent time the switch circuit is closed for a predetermined driving period, and during another time within the driving time the switch circuit is opened.

2. The circuit of claim 1, wherein during a discharge time which precedes said quiescent time, the switch circuit is closed and substantially identical voltages from the driving voltage source are applied at the driving terminals to the capacitive load, and during a charge up time which follows said quiescent time, the switch circuit is closed and a voltage difference is applied across the driving terminals by said driving voltage source.

* * * * *